United States Patent
Ishimaru (10) Patent No.: US 11,309,128 B2
(45) Date of Patent: Apr. 19, 2022

(54) CAPACITOR WITH SEAT PLATE (71) Applicant: Panasonic Intellectual Property Management Co., Ltd., Osaka (JP)

(72) Inventor: Yoshiaki Ishimaru, Saga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/011,033

(22) Filed: Sep. 3, 2020

(65) Prior Publication Data

US 2020/0402713 A1 Dec. 24, 2020

Related U.S. Application Data (63) Continuation of application No. PCT/JP2019/012822, filed on Mar. 26, 2019.

(30) Foreign Application Priority Data

Mar. 28, 2018 (JP) .............................. JP2018-063030

(51) Int. Cl.
H01G 2/02 (2006.01)
H01G 9/10 (2006.01)
(52) U.S. Cl.
CPC ................. *H01G 2/02* (2013.01); *H01G 9/10* (2013.01)
(58) Field of Classification Search
CPC .................................... H01G 2/02; H01G 9/08
See application file for complete search history.

(56) References Cited

FOREIGN PATENT DOCUMENTS

| JP | 3-142816 | 6/1991 | | |
|----|----------|--------|---|---|
| JP | 4-323816 | 11/1992 | | |
| JP | 2006-156860 | 6/2006 | | |
| JP | 2008-130774 | 6/2008 | | |
| JP | 2008-205345 | 9/2008 | | |
| JP | 2016-076600 | 5/2016 | | |
| WO | WO-2019150558 A1 * | 8/2019 | ............... | H01G 2/02 |
| WO | WO-2021060431 A1 * | 4/2021 | ............... | H01G 4/32 |

OTHER PUBLICATIONS

International Search Report of PCT application No. PCT/JP2019/012822 dated Jun. 11, 2019.

* cited by examiner

*Primary Examiner* — Eric W Thomas
(74) *Attorney, Agent, or Firm* — McDermott Will & Emery LLP (57) ABSTRACT A seat-plate-mounted capacitor includes a capacitor body and a seat plate. The capacitor body includes a case and a sealing member. The case includes a tubular part and a bottom wall that closes a first end of the tubular part. The sealing member closes a second end of the tubular part that is opposite to the first end. The capacitor body is disposed so that the sealing member is adjacent to the seat plate. The seat plate includes a base part and a support wall. The tubular part has an annular recess surrounding the tubular part, a first maximum diameter portion disposed closer to the bottom wall than the annular recess is, and a second maximum diameter portion disposed closer to the second end than the annular recess is. A diameter A of the first maximum diameter portion, a diameter B of the second maximum diameter portion, and an inner diameter C of the support wall satisfy a relation A>C>B, in a state that the capacitor body is not installed in the seat plate.

11 Claims, 6 Drawing Sheets

CAPACITOR WITH SEAT PLATE

RELATED APPLICATIONS

This application is a continuation of the PCT International Application No. PCT/JP2019/012822 filed on Mar. 26, 2019, which claims the benefit of foreign priority of Japanese patent application No. 2018-063030 filed on Mar. 28, 2018, the contents all of which are incorporated herein by reference.

TECHNICAL FIELD

The present disclosure relates to a seat-plate-mounted capacitor in which vibration resistance is taken into consideration.

BACKGROUND

A capacitor including a capacitor body and a seat plate retaining the capacitor body (hereinafter referred to as a "seat-plate-mounted capacitor") is widely used in applications such as surface mounting. The capacitor body in a cylindrical shape is mounted so that its axis intersects the mounting surface. In order to maintain a good contact state between such a capacitor and the mounting surface, it is required that the capacitor have a high level of vibration resistance. Japanese Patent Unexamined Publication No. 2008-130774 proposes an electronic component provided with an insulating support that satisfies the condition $s1 < c \le s2$, where c is the diameter of the electronic component, and s1 and s2 are respectively the length of the lower end and the length of the upper end in a component support space of the insulating support.

Japanese Patent Unexamined Publication No. 2016-076600 proposes an embodiment of a surface mount-type capacitor in which two contact parts for pressing the outer peripheral surface of the capacitor body are provided at positions that are closest to the central axis of the capacitor body in the inner surface of each sidewall of the seat plate.

SUMMARY

A seat-plate-mounted capacitor according to an embodiment of the present disclosure includes a capacitor body and a seat plate in which the capacitor body is installed. The capacitor body includes a case and a sealing member. The case includes a tubular part having a cylindrical shape and a bottom wall closing a first end of the tubular part. The sealing member closes a second end of the tubular part that is opposite to the first end. The capacitor body is disposed so that the sealing member is adjacent to the seat plate. The seat plate includes a base part and a support wall extending from the base part along a circumferential surface of the tubular part. The tubular part has an annular recess surrounding the tubular part, a first maximum diameter portion, and a second maximum diameter portion. The annular recess is located in a portion of the tubular part that contacts the sealing member, and is recessed toward the sealing member. The first maximum diameter portion is disposed closer to the bottom wall than the annular recess is. The second maximum diameter portion is disposed closer to the second end than the annular recess is. A diameter A of the first maximum diameter portion, a diameter B of the second maximum diameter portion, and an inner diameter C of the support wall satisfy a relation $A > C > B$ in a state that the capacitor body is not installed in the seat plate.

The present disclosure is able to provide a seat-plate-mounted capacitor that exhibits excellent vibration resistance with a simple configuration.

BRIEF DESCRIPTION OF DRAWINGS

FIG. 4 is a cross-sectional view of the seat plate, taken along line Iv-Iv in

FIG. 2.

DESCRIPTION OF EMBODIMENTS

For conventional seat-plate-mounted capacitors, it becomes more difficult to design the seat-plate-mounted capacitor for securing a sufficiently high level of vibration resistance as the sizes of the capacitors become smaller.

A seat-plate-mounted capacitor according to one embodiment of the present disclosure includes a capacitor body and a seat plate in which the capacitor body is installed. The capacitor body includes a case having a cylindrical shape. A capacitor element is enclosed in the cylindrical case. The capacitor body including a cylindrical case generally includes a wound-type capacitor element. On the other hand, the case of a capacitor body including a wound-type capacitor element can generally be regarded as having a cylindrical shape. A liquid that can contain an electrolyte salt is enclosed inside the case as needed.

Examples of the type of the capacitor body may include, but are not particularly limited to, what is called an aluminum electrolytic capacitor, a tantalum electrolytic capacitor, a solid electrolytic capacitor containing a solid electrolyte, and a hybrid electrolytic capacitor.

The cylindrical shape may include a substantially cylindrical shape. More specifically, the case may not necessarily be in a cylindrical shape in a strict sense, but may be regarded as having a cylindrical shape as long as its cross section (for example, the cross section at the center of the height direction) that is perpendicular to the axial direction (hereinafter referred to as the Z-axis direction) is in a substantially circular shape. The term "a substantially circular shape" refers to a shape that has a circularity of, for example, 0.95 or greater, preferably 0.99 or greater. Hereafter, the cross section perpendicular to the Z-axis direction is referred to as the X-Y cross section.

The case includes a tubular part having a cylindrical shape and a bottom wall closing one end of the tubular part. The other end of the tubular part (hereinafter referred to as an "open end") is closed by a sealing member and is disposed at the seat plate-end. The tubular part includes an annular recess recessed toward the sealing member and surrounding the tubular part, at a portion of the tubular part that contacts the sealing member. The annular recess is formed by a process such as reducing of the tubular part for securing the sealing member to the case, or swaging (curling) of the open end. The cylindrically-shaped case is generally supplied as a closed-bottom metal can. The closed-bottom metal can may be formed of a metal such as aluminum, an aluminum alloy, and a stainless steel. A surface layer having a desired function (such as an oxide layer) may be formed on the outer surface of the closed-bottom metal can.

The seat plate includes a base part (or a bottom part) and a support wall extending from the base part along a circumferential surface of the tubular part of the case. The support wall may preferably extend substantially in a Z-axis direction. The shape of the support wall is not particularly limited to any shape, and the height of the support wall need not be uniform. From the viewpoints of ensuring the ease of installing the capacitor body and distinguishing different polar terminals easily, the support wall may have an asymmetric shape as a whole. It is also possible that the height of the support wall at one position may be varied from that at another position.

The tubular part of the case includes a first maximum diameter portion disposed closer to the bottom wall than the annular recess is, and a second maximum diameter portion disposed closer to the open end than the annular recess is. That is, the diameter of the tubular part should not be uniform along the Z-axis direction but needs to be slightly varied.

The first maximum diameter portion is a portion at which the diameter of the circular shape or the substantially circular shape (the maximum diameter in the case of the substantially circular shape) in an X-Y cross section is maximum, in a portion that is closer to the bottom wall than the annular recess is. The second maximum diameter portion is a portion at which the diameter of the circular shape or the substantially circular shape (the maximum diameter in the case of the substantially circular shape) in an X-Y cross section is maximum, in a portion that is closer to the open end than the annular recess is.

In the portion that is closer to the bottom wall than the annular recess is, diameter A of the first maximum diameter portion and diameter D of a minimum diameter portion satisfy the relation $1.0 \leq A/D \leq 1.1$, for example, when the portion of the tubular part (excluding the boundary between the tubular part and the bottom wall) at which the diameter of the circular shape or the substantially circular shape in the X-Y cross section (the maximum diameter in the case of substantially circular shape) is minimum is defined as the minimum diameter portion.

Herein, diameter A of the first maximum diameter portion, diameter B of the second maximum diameter portion, and inner diameter C of the support wall satisfy the relation $A>C>B$, in a state that the capacitor body is not installed in the seat plate. By satisfying the relation $A>C$, the first maximum diameter portion of the tubular part of the case receives a sufficiently high pressure (external force) from the support wall of the seat plate, and also obtains an appropriate level of anchoring effect. As a result, the vibration resistance of the seat-plate-mounted capacitor is significantly increased. In addition, since there is an anchoring effect that causes the first maximum diameter portion to be engaged with the inner surface of the support wall, the seat plate does not require high dimensional accuracy. On the other hand, by satisfying the relation $C>B$, the capacitor body can be installed in the seat plate more easily.

Inner diameter C of the support wall is the inner diameter that is measured at an engaging position of the support wall at which the support wall contacts the first maximum diameter portion. The inner diameter of the support wall is obtained by measuring the distance between the inner surfaces of the portions of the support wall that are opposite to each other at the engaging position. The distance between such inner surfaces may be obtained by measuring a distance at every 90 degrees in an X-Y cross section so that the central angle is angularly equal, and obtaining the mean value of the measured distances.

The phrase "a portion of the support wall is directly opposite to another portion thereof" means that a portion of the support wall and another portion of the support wall face each other in an X-Y cross section of the support wall at an angle of 170 degrees to 190 degrees through the center of the cross section.

The capacitor element includes an anode member, a cathode member, a separator interposed between the anode member and the cathode member, an anode lead wire electrically connected to the anode member, and a cathode lead wire electrically connected to the cathode member. In the case of a wound-type capacitor element, a sheet-shaped anode member and a sheet-shaped cathode member are spirally wound with a separator interposed therebetween.

Generally, the anode lead wire and the cathode lead wire extend outwardly from the edge face at the open end of the capacitor body. The base part of the seat plate may be provided with through-holes for inserting the lead wires therethrough, grooves for enclosing the lead wires, or the like. More specifically, the base part of the seat plate may include, for example, a first through-hole through which the anode lead wire is inserted, a second through-hole through which the cathode lead wire is inserted, a first groove provided from around the first through-hole along the outer surface of the base part, and a second groove provided from around the second through-hole along outer surface of the base part. Then, the anode lead wire and the cathode lead wire are bent along the seat plate and disposed respectively along the first groove and the second groove.

Next, it is preferable that distance E from the outer surface of the base part 21 of the seat plate to the first maximum diameter portion and distance F from the first maximum diameter portion to the tip end of the support wall satisfy the relation $0.1 \leq F/E \leq 1.0$. Here, the tip end of the support wall means the tip end of a portion of the support wall at which the height from the outer surface of the base part of the seat plate is maximum. Meanwhile, it is preferable that a portion of the support wall at which the height from the outer surface of the base part of the seat plate is minimum also can be engaged with the first maximum diameter portion.

When the F/E ratio is set to greater than or equal to 0.1, the durability of the support wall is increased against vibrations, and the stability in mounting the capacitor body to the seat plate is enhanced. On the other hand, when the F/E ratio is set to less than or equal to 1.0, the vibrations of the support wall itself are reduced, and the stability of mounting the seat-plate-mounted capacitor to a mounting surface is enhanced. When the support wall is excessively high, the balance between the seat plate and the capacitor is impaired. Consequently, the durability against vibrations is reduced, and an instable state may occur. In order to maintain the durability of the support wall and the mounting stability to the mounting surface in an even more balanced manner, it is preferable that the relation $0.2 \leq F/E \leq 0.9$ be satisfied, and it is more preferable that the relation $0.3 \leq F/E \leq 0.8$ be satisfied.

When the capacitor body is not installed in the seat plate, inner diameter C at a position closer to a tip end of the support wall may be smaller than that at a position closer to the base part. This significantly reduces the vibrations of the support wall itself. Moreover, the capacitor body receives a further higher pressure (external force) from the support wall. In addition, a further greater anchoring effect is obtained. As a result, the vibration resistance of the seat-plate-mounted capacitor is greatly improved.

In this case, inner diameter C1 of the support wall at its tip end may satisfy the relation C1>B when the capacitor body is not installed in the seat plate, so that the ease of installing the capacitor body onto the seat plate is not impaired. Note that the tip end of the support wall here means the tip end of a portion of the support wall at which the height from the outer surface of the base part is minimum. The distance between the portion with the minimum height and the portion that is directly opposite thereto is inner diameter C1.

When inner diameter C of the support wall decreases toward the tip end, the angle θ formed by the Z-axis direction and the support wall may preferably be from 1 degree to 10 degrees. Herein, the angle θ is an angle formed by the Z-axis direction and the linear line connecting a position of the support wall near the tip end that is closest to the axis of the capacitor body and a position of the support wall near the base that is farthest from the axis of the capacitor body.

Although the support wall may have any configuration, it is preferable that the support wall include two or more support posts, for example. The shapes of the two or more support posts may be different from each other. Each of the support posts may have an asymmetric shape.

When the support wall has two or more support posts, it is preferable that the two or more support posts be disposed point-symmetrically or substantially point-symmetrically with respect to the center of an X-Y cross section of the support wall. The phrase "substantially point-symmetrical" means that the centers of gravity of the support posts exist at angularly equivalent positions, for example, with respect to the center. It is preferable that the central angle formed by the centers of gravity of the adjacent support posts be 360/n degrees, where n is the number of the support posts. The number of the support posts may be from 2 to 10, for example. Taking the stability of mounting the capacitor body to the seat plate and the ease of manufacturing into consideration, the number of the support posts may preferably be 2, 3, or 4.

When the support wall has an even number of support posts, it is preferable that two of the even number of support posts be disposed opposite to each other in an X-Y cross section of the support wall.

The support wall may have a tubular shape such as to engage with a portion of the capacitor body that is closer to the open end. In other words, the support wall may have a frame shape having a tubular hollow portion. In this case, the support wall is able to support the entire circumferential surface of the portion of the capacitor body that is closer to the open end. Since the tubular support wall can significantly increase the stability in mounting the capacitor body onto the seat plate, the vibration resistance improves greatly.

The configuration according to the present exemplary embodiment is especially effective for a small-sized seat-plate-mounted capacitor in which the diameter A of the capacitor body is 10 mm or less, preferably 8 mm or less. As the size of capacitors has become smaller and smaller in recent years, small-sized seat-plate-mounted capacitors are desired to have greater vibration resistance. In the past, small-sized capacitors are considered to be less adversely affected by vibrations than large-sized capacitors. However, when the sizes of the terminals of capacitors become smaller as the sizes of the capacitors decrease, variations in the bending process of the terminals are more likely to occur. Thus, small-sized capacitors mounted on a circuit board are more likely to be adversely affected by vibrations. For example, cracks or breakage may occur in the terminals that are bend-processed. In view of such a problem, the configuration such as described above is able to improve vibration resistance significantly even for small-sized capacitors. The lower limit of diameter A of the capacitor body is about 3 mm, for example.

The relationship between diameter A of the first maximum diameter portion of the tubular part of the case and total height H of the seat-plate-mounted capacitor after the capacitor body and the seat plate are assembled together is not particularly limited. Meanwhile, the H/A ratio may be, for example, within the range from 0.5 to 2.0, inclusive. Here, when the H/A ratio is greater than or equal to 1 (particularly when greater than or equal to 1.4), the capacitor is more likely to be adversely affected by vibrations. The configuration such as described above is able to increase the vibration resistance of the capacitor even when the H/A ratio is greater than or equal to 1.

When the H/A ratio is greater than or equal to 1, it is preferable that distance E from the outer surface of the base part of the seat plate to the first maximum diameter portion having diameter A and total height H of the seat-plate-mounted capacitor have a relationship such that the E/H ratio is within the range from 0.2 to 0.5, inclusive. Within that range, the vibration resistance of the capacitor can be further increased.

Also, it is preferable that the sum (E+F) of distance E and distance F and the total height H of the seat-plate-mounted capacitor have a relationship such that the (E+F)/H ratio be within the range from 0.3 to 0.7, inclusive. Here, distance E is a distance from the outer surface of the base part of the seat plate to the first maximum diameter portion having diameter A, and distance F is a distance from the first maximum diameter portion to the tip end of the support wall. Within that range, the vibration resistance of the capacitor can be further increased. In this case, although the F/E ratio may be greater than 1, the vibration resistance can be enhanced further when the F/E ratio is within the range $0.1 \leq F/E \leq 1.0$.

Figure 2:
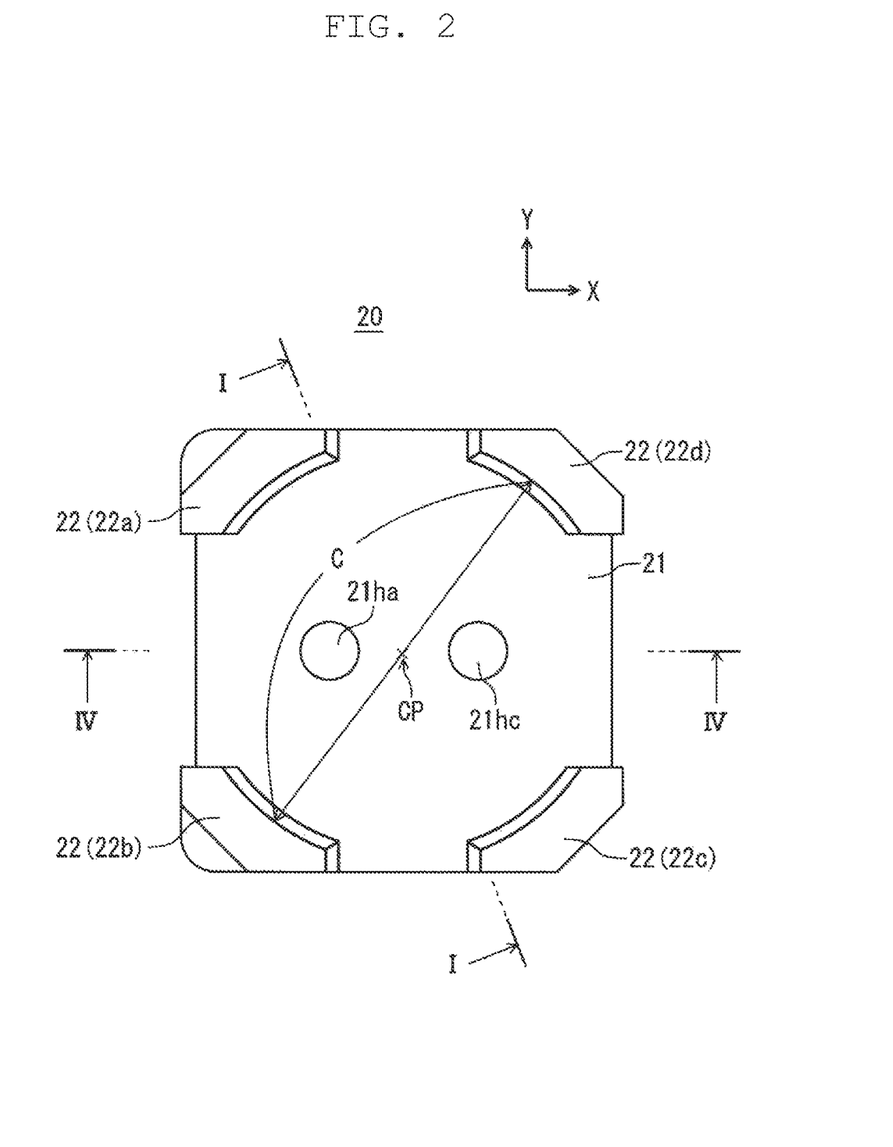
FIG. 2 is a top plan view of the seat plate to which a capacitor body has not yet been installed.

The thickness of the support wall is restricted by the size of the seat plate. It is preferable that the projected area of the base part of the seat plate in the Z-axis direction be greater than 100% and less than or equal to 150% of the projected area of the capacitor body (or the case) in the Z-axis direction. In many cases, the projected area of the base part is a rectangular shape or a substantially rectangular shape, and four support posts that form the support wall are provided at the four corners of the shape. Therefore, the maximum thickness of the support posts is preferably less than the maximum width of the four corners of the base part that protrudes from the projected area of the capacitor body. A substantially rectangular shape refers to a shape such that at least 50% of the peripheral length is a linear portion, the linear portion includes at least four line segments, the four line segments include two pairs of line segments that are parallel to each other, and one of the pairs of the line segments intersects the other one of the pairs at an angle of 85 degrees to 95 degrees. In addition, at least a portion of the four corners may be chamferred or processed to be in a round shape, as shown in FIG. 2.

Hereafter, exemplary embodiments of a seat-plate-mounted capacitor according to the present disclosure will be described in detail with reference to the drawings. It should be noted, however, that the present disclosure is not limited to the following embodiments.

Figure 1:
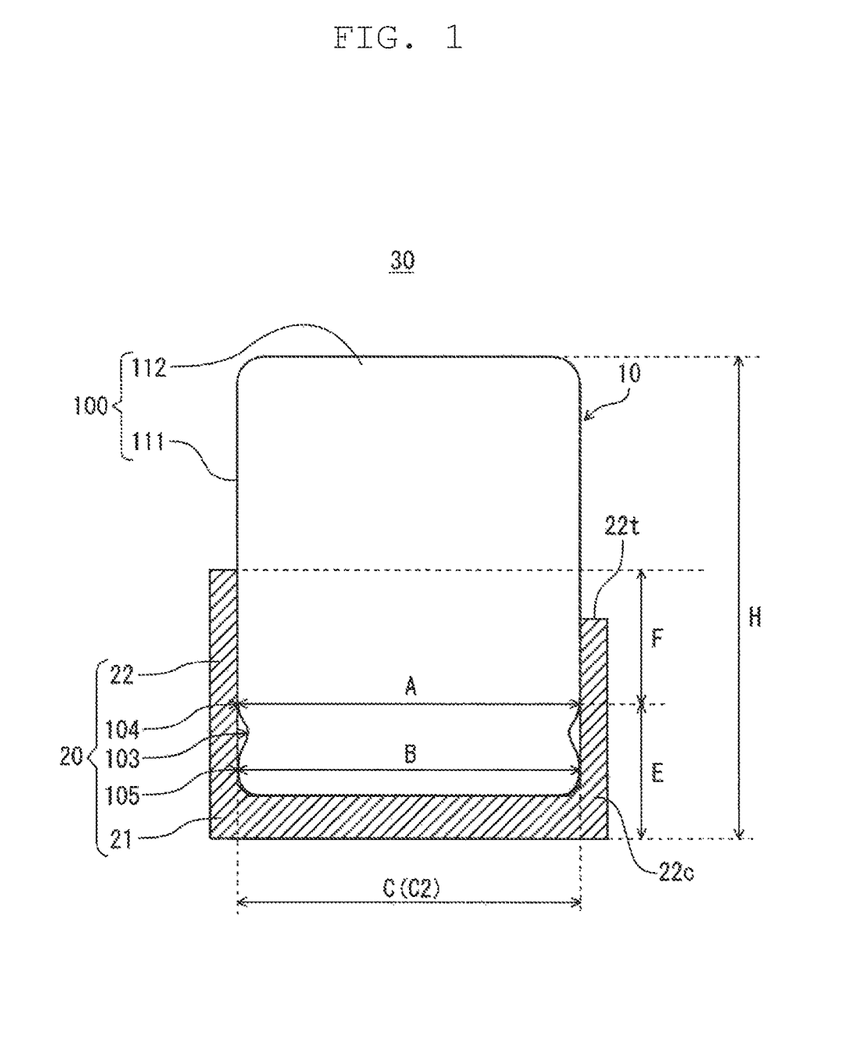
FIG. 1 is a schematic view illustrating a seat-plate-mounted capacitor according to an exemplary embodiment of the present disclosure, in which only a seat plate thereof is shown in cross section.
Figure 3:
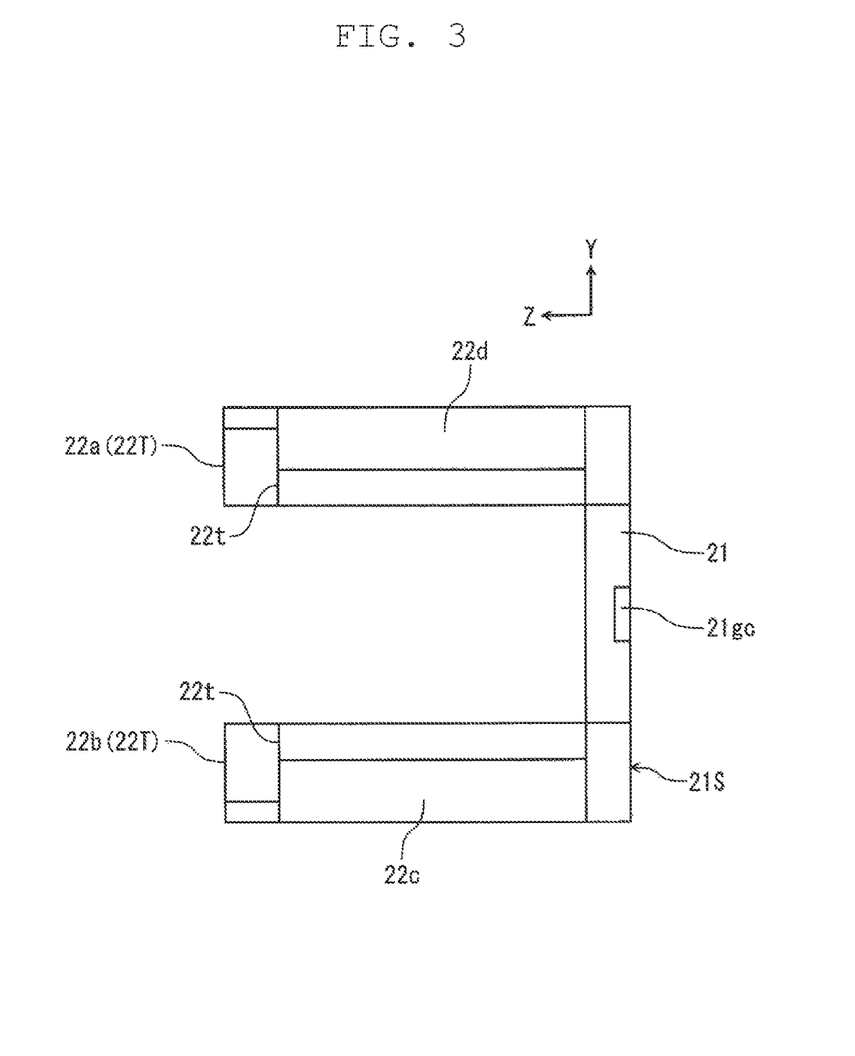
FIG. 3 is a side view illustrating the seat plate, viewed from the right hand side.
Figure 4:
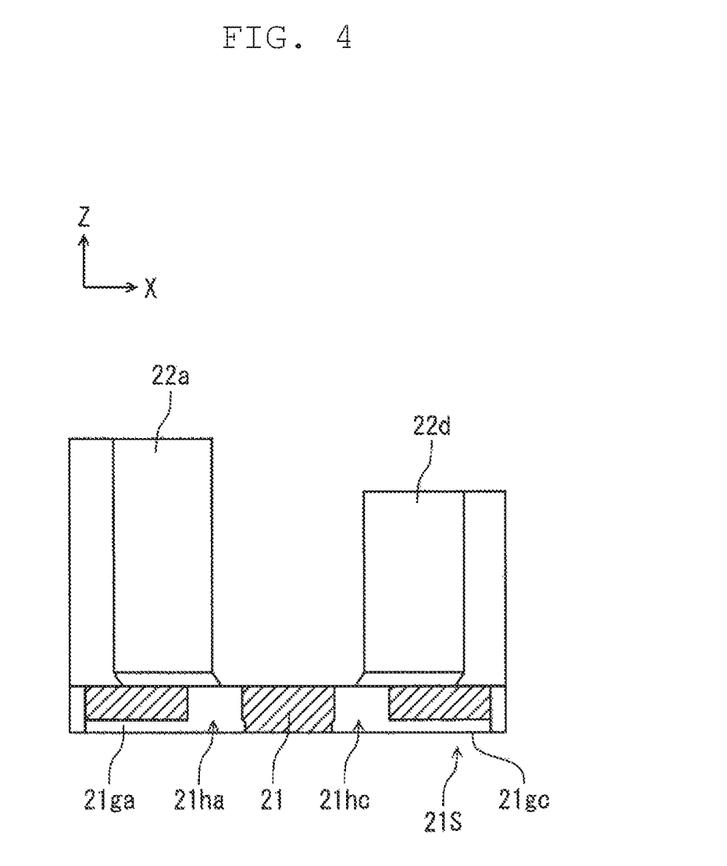
Figure 5:
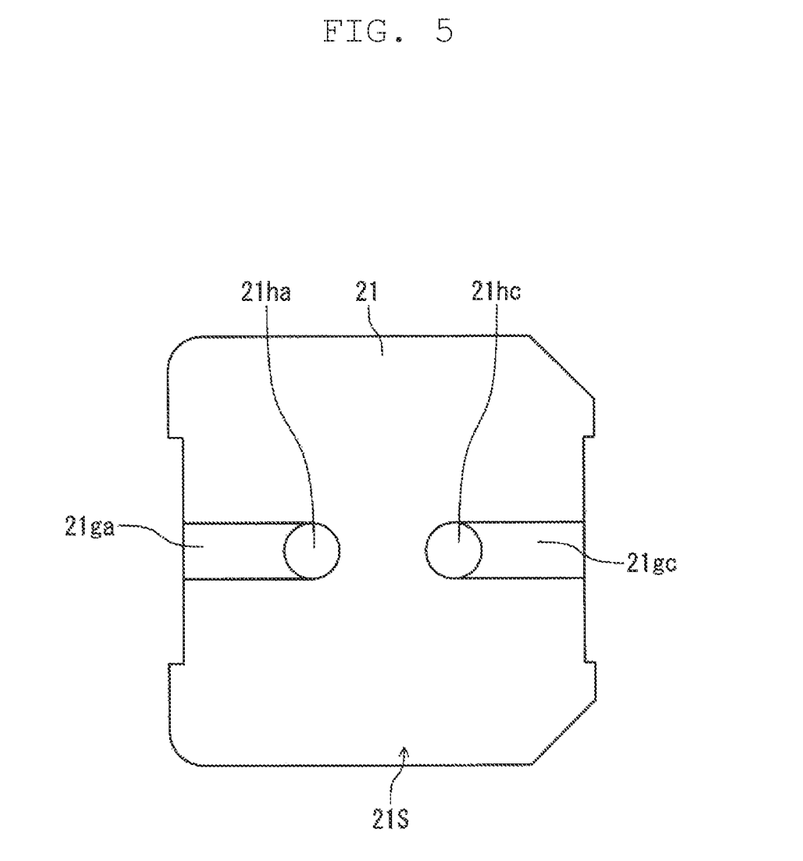
FIG. 5 is a bottom plan view illustrating the seat plate.
Figure 6:
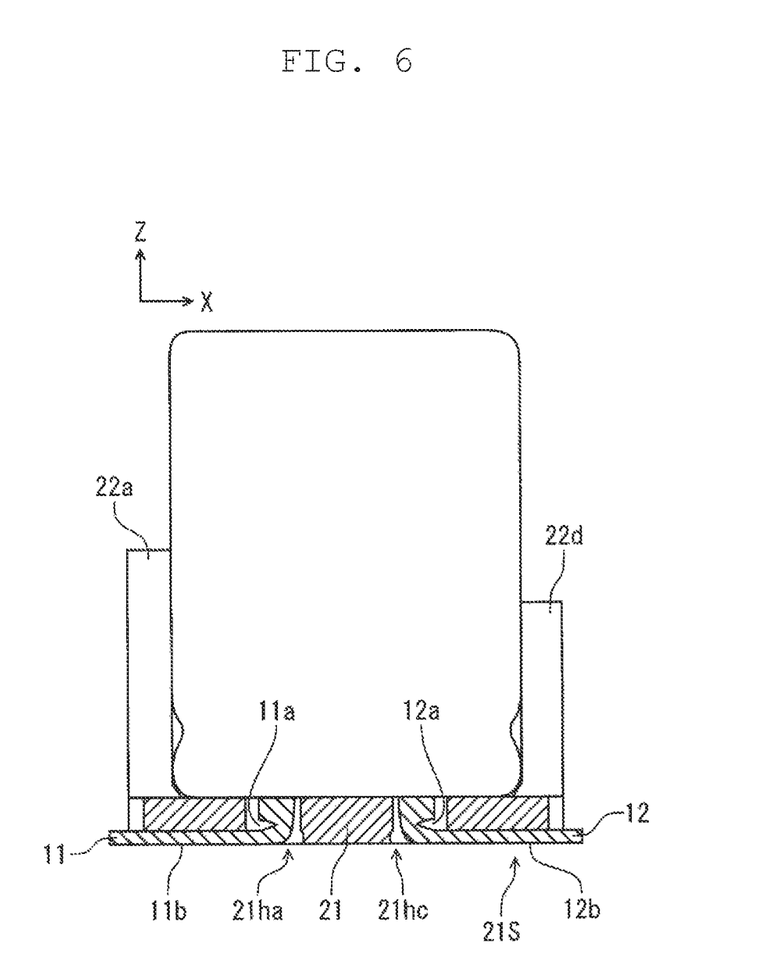
FIG. 6 is another schematic view showing terminals of the capacitor body, in which the seat plate of the seat-plate-mounted capacitor is shown in cross section.

FIG. 1 is a schematic view illustrating seat-plate-mounted capacitor 30 according to the present exemplary embodiment, in which only seat plate 20 thereof is shown in cross section. Seat-plate-mounted capacitor 30 includes capacitor body 10 and seat plate 20 in which capacitor body 10 is installed. FIG. 2 shows a top plan view of seat plate 20 to which capacitor body 10 has not yet been fitted. The cross section of seat plate 20 shown in FIG. 1 corresponds to the cross section taken along line I-I in FIG. 2. FIG. 3 is a side view illustrating seat plate 20 shown in FIG. 2, viewed from a right hand side. FIG. 4 is a cross-sectional view taken along line Iv-Iv in FIG. 2. FIG. 5 is a bottom plan view illustrating seat plate 20. FIG. 6 is another schematic view, in which only seat plate 20 of seat-plate-mounted capacitor 30 is shown in cross section, and which shows a state in which capacitor body 10 is installed in seat plate 20 shown in FIG. 4 and terminals of capacitor body 10 are inserted in through-holes of the base part.

Capacitor body 10 includes case 100 having a cylindrical shape. Case 100 is a closed-bottom metal can, which has tubular portion 111 and bottom wall 112 that closes one end of tubular portion 111. The other open end of tubular portion 111 is closed by a sealing member (not shown). Capacitor body 10 is disposed so that a portion thereof closer to the open end is installed in seat plate 20.

Seat plate 20 includes base part 21 and support wall 22 extending from base part 21 along a circumferential surface of tubular part 111 of case 100.

An annular recess 103 is formed near the open end of tubular part 111 by the processing in closing the open end with the sealing member. First maximum diameter portion 104 exists at a portion of tubular part 111 that is closer to bottom wall 112 than recess 103 is, and second maximum diameter portion 105 exists at a portion of tubular part 111 that is closer to the open end than recess 103 is. First maximum diameter portion 104 forms a first contact point with support wall 22.

Diameter A of first maximum diameter portion 104, diameter B of second maximum diameter portion 105, and inner diameter C of support wall 22 satisfy a relation A>C>B, in a state that capacitor body 10 is not installed in seat plate 20. In this case, a clearance gap is formed between support wall 22 and the portion of tubular part 111 that is closer to the open end of than recess 103 is, which includes second maximum diameter portion 105. Also, although it may depend on the material of support wall 22, a clearance gap may be formed between support wall 22 and the portion of tubular part 111 that is closer to bottom wall 112 than first maximum diameter portion 104 is.

With the above-described configuration, first maximum diameter portion 104 receives a sufficiently great pressure (external force) from support wall 22. Hence, the vibration resistance of capacitor body 10 is significantly increased. However, since a clearance gap may be formed between the tip end of support wall 22 and case 100, it is important to reduce vibrations of support wall 22 itself. In this respect, when distance E from outer surface 21S of base part 21 of seat plate 20 to first maximum diameter portion 104 and distance F from first maximum diameter portion 104 to tip end 22T of support wall 22 satisfy the relation $0.1 \leq F/E \leq 1.0$, vibrations of support wall 22 itself are also reduced significantly.

As illustrated in FIG. 2, which is a top plan view of seat plate 20, support wall 22 is provided with four support posts 22a to 22d that are disposed substantially point-symmetrically with respect to center CP of an X-Y cross section of support wall 22. The central angle formed by the centers of gravity of the adjacent support posts is approximately 90 degrees. When viewed in the top plan view, it will be understood that although the shapes of the four support posts 22a to 22d are asymmetrical, they have two symmetric surfaces. As shown in FIG. 2 and FIG. 5, which is the bottom plan view, base part 21 of seat plate 20 is in a substantially asymmetrical rectangular shape so that different polar terminals can be distinguished from each other easily.

Among four support posts 22a to 22d, two support posts 22c and 22d have a lower height than the other two support posts 22a and 22b so as to ensure that capacitor body 10 can be installed easily. In such cases where the support posts have different heights, the distance from first maximum diameter portion 104 to the tip end of support post 22a or 22b with a greater height is distance F. Also, a predetermined distance between support post 22c or 22d with a lower height and support post 22a or 22b with a greater height that is opposite thereto is inner diameter C.

Inner diameter C of support wall 22 may become slightly smaller toward tip end 22T of support wall 22 in a state that capacitor body 10 is not installed. That is, inner diameter C of support wall 22 is not uniform along the Z-axis direction. Inner diameter C is measured at an engaging position of support wall 22 at which support wall 22 contacts first maximum diameter portion 104.

Base part 21 is provided with first through-hole 21ha and second through-hole 21hc through which anode lead wire 11 and cathode lead wire 12 of capacitor body 10 are allowed to be inserted. Also, outer surface 21S of base part 21 is provided with first groove 21ga and second groove 21gc respectively around first through-hole 21ha and second through-hole 21hc.

In a small-sized capacitor, both anode lead wire 11 and cathode lead wire 12 are bent with a large curvature inside base part 21 that has a small thickness (for example, a thickness of 0.7 mm or less). In the example shown in the figure, notches 11a and 12a are respectively provided at the bent portions of anode lead wire 11 and cathode lead wire 12 in order to bend the lead wires easily. Each of anode lead wire 11 and cathode lead wire 12 is formed of a line-shaped member. The line-shaped member is squashed from notches 11a and 12a at the bent portion of the line-shaped member onward, whereby flat mount portions 11b and 12b are formed. Such anode lead wire 11 and cathode lead wire 12 that are bend-processed in the just-described manner are susceptible to vibrations. Therefore, it is highly necessary to improve vibration resistance.

The sealing member should preferably be made of an insulative substance. The insulative substance may preferably be an elastic material. Using a sealing member that contains an elastic material, such as a rubber, can ensure high sealing capability. From the viewpoint of easily obtaining high heat resistance, preferable examples include silicone rubber, fluorocarbon rubber, ethylene propylene rubber, chlorosulfonated polyethylene rubber (such as Hypalon™ rubber), butyl rubber, and isoprene rubber.

Hereinbelow, the present disclosure will be described in detail with reference to the following examples and comparative examples. It should be noted, however, that the present disclosure is not limited to the following examples.

EXAMPLE 1

In the present example, a wound-type electrolytic capacitor A1 was prepared. The electrolytic capacitor A1 had a rated voltage of 35 V, a rated capacitance of 68 µF, a diameter A of 6.5 mm, a diameter B of 6.3 mm, and a total height H of the seat-plate-mounted capacitor of 8.0 mm. The open end of the electrolytic capacitor A1 was closed with a sealing member made of butyl rubber.

The seat plate having an inner diameter C of 6.4 mm was used here. The seat plate had a support wall equipped with two negative-side support posts with a greater height and two positive-side support posts with a smaller height (four support posts in total). The distance (E+F1) from the outer surface of the base part to the tip end (tip end 22T) of the higher support post was 4.5 mm, and the distance (E+F2) from the outer surface of the base part to tip end 22t of the lower support post was 3.7 mm.

[Evaluation of Vibration Resistance]

A vibration test was carried out in the following manner. Each of the electrolytic capacitors was secured to the seat plate, and the seat plate was further secured to a vibrating plate. A sine wave with a frequency range of 5 Hz to 2000 Hz, a maximum amplitude of 5.0 mm, and an amplitude acceleration of 294 m/s² was imparted to the vibrating plate. The vibration test was carried out for each of the longer-axis direction (Z-axis direction) of the capacitor and two directions that are perpendicular thereto (i.e., X-axis direction and Y-axis direction). The vibration time was set to 2 hours for each direction. Thereafter, the external appearance condition and the capacitance change rate were determined. When the anode lead wire and the cathode lead wire showed cracks and the seat-plate-mounted capacitor itself came off from the substrate, it was determined as NG. When the anode lead wire and the cathode lead wire showed cracks or the like, it was determined as NB. The rest of the cases were determined as OK. The capacitance change rate was indicated by the ratio (capacitance after the test)/(initial capacitance). The results are shown in Table 1.

[Evaluation of Engaging Force]

When the capacitor body was pressed into the seat plate to cause the capacitor body to engage with the seat plate without securing the anode lead wire and the cathode lead wire to the seat plate, the peak value of the pressing force was measured with a digital force gauge, and the measured peak value was employed as the engaging force between the capacitor body and the seat plate. The engaging force was determined per unit contact length (mm) between the electrolytic capacitor and the seat plate. The results are shown in Table 1.

TABLE 1

| Capacitor | First maximum diameter portion A [mm] | Second maximum diameter portion B [mm] | Inner diameter of support wall C [mm] | Total height H [mm] | Support post height Negative side [mm] | Support post height Positive side [mm] |
| --- | --- | --- | --- | --- | --- | --- |
| A1 | 6.5 | 6.3 | 6.4 | 8.0 | 4.5 | 3.7 |
| A2 | 6.5 | 6.3 | 6.4 | 8.0 | 3.3 | 3.3 |
| A3 | 6.5 | 6.3 | 6.4 | 8.0 | 5.5 | 4.7 |
| A4 | 6.5 | 6.3 | 6.4 | 8.0 | 6.5 | 5.7 |
| A5 | 6.5 | 6.3 | 6.4 | 6.1 | 4.5 | 3.7 |
| A6 | 6.5 | 6.3 | 6.4 | 6.1 | 6.1 | 5.3 |
| A7 | 8.1 | 7.9 | 8.0 | 10.5 | 8.5 | 7.5 |
| A8 | 8.1 | 7.9 | 8.0 | 10.5 | 9.9 | 9.0 |
| A9 | 10.1 | 9.7 | 10.0 | 10.5 | 8.5 | 7.5 |
| A10 | 4.0 | 3.8 | 3.9 | 6.0 | 4.0 | 3.5 |
| B1 | 6.5 | 6.3 | 6.6 | 8.0 | 4.5 | 3.7 |
| B2 | 6.5 | 6.3 | 6.6 | 6.1 | 4.5 | 3.7 |
| B3 | 6.5 | 6.3 | 6.6 | 8.0 | 6.5 | 5.7 |
| B4 | 6.5 | 6.3 | 6.5 | 8.0 | 4.5 | 3.7 |
| B5 | 6.5 | 6.3 | 6.5 | 8.0 | 4.5 | 2.5 |
| B6 | 6.5 | 6.3 | 6.5 | 8.0 | 2.5 | 2.5 |

| Capacitor | E [mm] | F [mm] | F/E | H/A | External appearance | Engaging force (kg/mm) | Capacitance change rate |
| --- | --- | --- | --- | --- | --- | --- | --- |
| A1 | 3.15 | 1.35 | 0.43 | 1.23 | OK | 0.021 | 0.97 |
| A2 | 3.15 | 0.15 | 0.05 | 1.23 | OK | 0.020 | 0.94 |
| A3 | 3.15 | 2.35 | 0.75 | 1.23 | OK | 0.022 | 0.97 |
| A4 | 3.15 | 3.35 | 1.06 | 1.23 | OK | 0.022 | 0.93 |
| A5 | 3.15 | 1.35 | 0.43 | 0.94 | OK | 0.020 | 0.99 |
| A6 | 3.15 | 2.95 | 0.94 | 0.94 | OK | 0.021 | 0.98 |
| A7 | 4.80 | 3.70 | 0.77 | 1.30 | OK | 0.026 | 0.97 |
| A8 | 4.80 | 5.10 | 1.06 | 1.30 | OK | 0.026 | 0.92 |
| A9 | 4.80 | 3.70 | 0.77 | 1.04 | OK | 0.031 | 0.97 |
| A10 | 2.20 | 1.80 | 0.82 | 1.50 | OK | 0.016 | 0.97 |
| B1 | — | — | — | 1.23 | NB | — | 0.78 |
| B2 | — | — | — | 0.94 | NB | — | 0.82 |
| B3 | — | — | — | 1.23 | NG | — | 0.72 |
| B4 | 3.15 | 1.35 | — | 1.23 | NB | 0.005 | 0.90 |
| B5 | — | — | — | 1.23 | NG | 0.003 | 0.75 |
| B6 | — | — | — | 1.23 | NG | 0.001 | 0.69 |

EXAMPLES 2 TO 10 AND COMPARATIVE EXAMPLES 1 TO 6

Electrolytic capacitors A2 to A10 of Examples and capacitors B1 to B6 of Comparative Examples were prepared in the same manner as described in Example 1, except that the parameters were varied as shown in Table 1, and the prepared capacitors were evaluated. The results are shown in Table 1.

From the results shown in Table 1, it will be understood that a seat-plate-mounted capacitor that exhibits excellent vibration resistance with a simple configuration can be provided by satisfying predetermined conditions.

The present disclosure is applicable to electrolytic capacitors that require vibration resistance, such as solution-type electrolytic capacitors, hybrid-type electrolytic capacitors, and solid electrolytic capacitors.

What is claimed is:

1. A seat-plate-mounted capacitor comprising:
   a capacitor body; and
   a seat plate in which the capacitor body is installed, wherein:
   the capacitor body includes:
      a case including a tubular part having a cylindrical shape and a bottom wall closing a first end of the tubular part; and
      a sealing member closing a second end of the tubular part, the second end being opposite to the first end,
   the capacitor body is disposed so that the sealing member is adjacent to the seat plate,
   the seat plate includes:
      a base part; and
      a support wall extending from the base part along a circumferential surface of the tubular part,
   the tubular part has an annular recess surrounding the tubular part, a first maximum diameter portion, and a second maximum diameter portion, the annular recess being located in a portion of the tubular part that contacts the sealing member and being recessed toward the sealing member, the first maximum diameter portion being disposed closer to the bottom wall than the annular recess is, the second maximum diameter portion being disposed closer to the second end than the annular recess is,
   a diameter A of the first maximum diameter portion, a diameter B of the second maximum diameter portion, and an inner diameter C of the support wall satisfy a relation A>C>B in a state that the capacitor body is not installed in the seat plate,
   a distance E from an outer surface of the base part of the seat plate to the first maximum diameter portion and a distance F from the first maximum diameter portion to a tip end of the support wall satisfy a relation $0.43 \leq F/E \leq 0.94$, and
   the diameter A and a total height H of the seat-plate-mounted capacitor satisfy a relation $0.5 \leq H/A \leq 1.5$.

2. The seat-plate-mounted capacitor according to claim 1, wherein in a state that the capacitor body is not installed in the seat plate, the inner diameter C in a position closer to a tip end of the support wall is smaller than the inner diameter C in a position closer to the base part.

3. The seat-plate-mounted capacitor according to claim 1, wherein:
   the support wall includes two or more support posts; and
   in a cross section of the support wall that is perpendicular to an axis of the capacitor body, the two or more support posts are disposed point-symmetrically with respect to a center of the cross section.

4. The seat-plate-mounted capacitor according to claim 1, wherein:
   the support wall includes an even number of support posts; and
   in a cross section of the support wall that is perpendicular to an axis of the capacitor body, two of the even number of support posts are disposed opposite to each other.

5. The seat-plate-mounted capacitor according to claim 1, wherein the diameter A is 10 mm or less.

6. A seat-plate-mounted capacitor comprising:
   a capacitor body; and
   a seat plate in which the capacitor body is installed, wherein:
   the capacitor body includes:
      a case including a tubular part having a cylindrical shape and a bottom wall closing a first end of the tubular part; and
      a sealing member closing a second end of the tubular part, the second end being opposite to the first end,
   the capacitor body is disposed so that the sealing member is adjacent to the seat plate,
   the seat plate includes:
      a base part; and
      a support wall extending from the base part along a circumferential surface of the tubular part,
   the tubular part has an annular recess surrounding the tubular part, a first maximum diameter portion, and a second maximum diameter portion, the annular recess being located in a portion of the tubular part that contacts the sealing member and being recessed toward the sealing member, the first maximum diameter portion being disposed closer to the bottom wall than the annular recess is, the second maximum diameter portion being disposed closer to the second end than the annular recess is,
   a diameter A of the first maximum diameter portion, a diameter B of the second maximum diameter portion, and an inner diameter C of the support wall satisfy a relation A>C>B in a state that the capacitor body is not installed in the seat plate,
   the support wall includes two or more support posts,
   two or more support posts includes a first support post and a second support post, the second support post having a lower height than the first support post, and
   a distance H1 from an outer surface of the base part of the seat plate to a tip end of the first support post and a distance H2 from the outer surface of the base part of the seat plate to a tip end of the second support post satisfy a relation $1.10 \leq H1/H2 \leq 1.22$.

7. The seat-plate-mounted capacitor according to claim 6, wherein a distance E from the outer surface of the base part of the seat plate to the first maximum diameter portion and a distance F from the first maximum diameter portion to a tip end of the support wall satisfy a relation $0.1 \leq F/E \leq 1.0$.

8. The seat-plate-mounted capacitor according to claim 6, wherein in a state that the capacitor body is not installed in the seat plate, the inner diameter C in a position closer to a tip end of the support wall is smaller than the inner diameter C in a position closer to the base part.

9. The seat-plate-mounted capacitor according to claim 6, wherein in a cross section of the support wall that is perpendicular to an axis of the capacitor body, the two or more support posts are disposed point-symmetrically with respect to a center of the cross section.

10. The seat-plate-mounted capacitor according to claim 6, wherein in a cross section of the support wall that is perpendicular to an axis of the capacitor body, two of the even number of support posts are disposed opposite to each other.

11. The seat-plate-mounted capacitor according to claim 6, wherein the diameter A is 10 mm or less.

* * * * *